Figure 1:
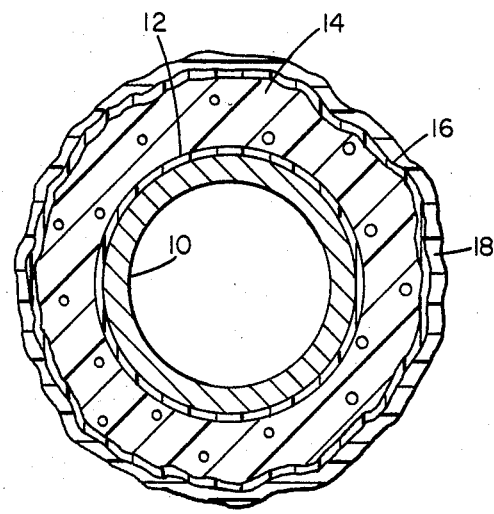

United States Patent [19]

Thomas et al.

[11] Patent Number: 4,589,275

[45] Date of Patent: May 20, 1986

[54] PIPE COATING

[75] Inventors: Samuel J. Thomas, Hamilton; James M. Robich, Watertown, both of Mass.; Robert L. Hayes, Walnut Creek, Calif.

[73] Assignee: The Kendall Company, Boston, Mass.

[21] Appl. No.: 630,439

[22] Filed: Jul. 13, 1984

Related U.S. Application Data

[62] Division of Ser. No. 369,036, Apr. 16, 1982, Pat. No. 4,523,141.

[51] Int. Cl.⁴ ............................................. G01M 3/00
[52] U.S. Cl. .............................. 73/40.5 R; 73/40.5 A; 174/11 R
[58] Field of Search ............... 73/40.5 R, 40.5 A, 592, 73/40, 49.1; 340/605; 138/103, 104, 149, 36; 174/11 R, 47; 285/47, 93

[56] References Cited

U.S. PATENT DOCUMENTS

| | | | |
|---|---|---|---|
| 2,759,175 | 8/1956 | Spalding | 138/104 |
| 3,420,277 | 1/1969 | Ceintrey | 138/143 |
| 3,425,455 | 2/1969 | Kilpert et al. | 138/143 |
| 3,882,382 | 5/1975 | Johnson | 340/605 |
| 4,259,553 | 3/1981 | Tanaka et al. | 73/40.5 R |
| 4,288,654 | 9/1981 | Blom et al. | 73/40.5 R X |
| 4,348,794 | 9/1982 | Kim et al. | 138/104 |
| 4,446,892 | 4/1984 | Maxwell | 138/104 |

FOREIGN PATENT DOCUMENTS

| | | | |
|---|---|---|---|
| 2940193 | 4/1981 | Fed. Rep. of Germany | 340/605 |
| 3018781 | 12/1981 | Fed. Rep. of Germany | 138/104 |
| 156216 | 10/1969 | Japan | 138/104 |
| 848423 | 9/1960 | United Kingdom | 73/40.5 R |

Primary Examiner—Stewart J. Levy
Assistant Examiner—Hezron E. Williams

[57] ABSTRACT

Pipe coating having a thermal insulating layer of polymeric material and an outer barrier layer is provided with an additional layer between the two layers to facilitate testing of the latter for discontinuities. The intermediate layer can be electroconductive, smooth-surfaced, or of color contrasting to that of the barrier layer.

3 Claims, 2 Drawing Figures

PIPE COATING

This is a division of application Ser. No. 369,036 filed Apr. 16, 1982, now U.S. Pat. No. 4,523,141.

This invention relates to coated pipe and pertains more specifically to pipe coated with a thermal insulating layer and with an abrasion-resistant and moisture-impermeable outer barrier layer for use in pipelines, particularly pipelines for oil, gas, or water.

Metal, e.g. steel, pipe for use in pipelines is commonly provided with a protective coating in a variety of forms including primary corrosion-resistant and/or thermal insulating layers and one or more outer barrier layers of polymeric material usually of the order of 25 to 120 mils in thickness, the outermost barrier layer being tough and abrasion resistant to provide mechanical protection for the pipe during handling and installation as well as in service. In order to prevent cathodic disbondment and other ills of the protective coating, it is essential that the outer barrier layer be free from pinholes or other small discontinuities permitting access of water or moisture to the pipe, and several different test procedures are in widespread use for detecting the presence of such discontinuities in the finished coated pipe so that they can be repaired before the pipe is laid. One frequently employed test procedure is electrical detection, involving measurement of electrical conductivity or resistivity along the face of the barrier layer using the metal pipe itself as one pole of an electric couple. Another method relies upon optical reflectance from the outer surface of the barrier layer. Still another procedure employs ultrasonic scanning of the outer barrier layer.

In many pipelines there is required in addition to abrasion- and corrosion-resistant coatings, thermal insulating coatings as well, particularly if the pipeline is located in a cold climate, or if it is laid in or adjacent a permafrost layer. The thermal insulation is required not only to protect the external environment of the pipe from the effects of heat but also to maintain the contents of the pipe at the desired temperature and to prevent changes in flow rate caused by changes in viscosity of liquid within the pipe. Such thermal insulation is provided by one or more additional layers of polymeric material, usually foamed plastic, beneath the outer barrier layer, as described for example in U.S. Pat. Nos. 2,857,937, 3,420,277, 3,731,710, 3,807,458 or 3,992,237. These foamed plastic layers are applied by spraying a foamable plastic composition on the surface of previously applied layers such as anti-corrosion or intermediate layers, and allowing it to foam and cure in place, preferably with preheating of the pipe to facilitate rapid curing and setting of the foamable composition in place. The outer barrier layer is applied over the foamed layer either as a preformed plastic tape which may incorporate a pressure-sensitive adhesive inner face and which is applied by spiral wrapping of the tape either after or just before foaming of the insulating layer is completed; or by extrusion or coextrusion of the outer barrier layer in the form of a tape directly upon the outer face of the insulating layer in the form of a spiral wrapping, or by spraying a suitable liquid composition on the face of the insulating layer and causing it to solidify either by cooling, drying, or curing.

In any case, because of the surface irregularities and the relative thickness of the foamed plastic layer, which may be from 0.5 to several inches thick, and the inherent variation in thickness and surface characteristics of such a layer arising during its application and formation, the test methods formerly used to detect pinholes and similar discontinuities in the outer barrier layer are no longer effective.

It has now been found that the effectiveness of such test methods can be maintained by providing in a pipe coated with a thermal insulating layer of polymeric material having an irregular outer surface and an outer barrier layer of polymeric material, the improvement comprising an intermediate layer interposed between and bonded to said foamed plastic and said outer barrier layers to facilitate detection of pinholes and other discontinuities in said outer barrier layer. In a preferred embodiment, the insulating layer is of foamed plastic and the outer barrier layer is of non-foamed plastic. The intermediate layer can be electroconductive, in the form of metal foil or a layer of plastic rendered electroconductive by incorporation of suitable conductive particles such as conductive carbon black, metallic compounds, or metal. The presence of such an electrically conductive layer immediately beneath the outer barrier layer makes it possible, by using the conductive layer as one pole of an electrical couple, to employ conventional electric testing equipment and methods for detecting discontinuities in the outer barrier layer. In the alternative, the intermediate layer can be made of nonfoamed plastic of a color contrasting to that of the barrier layer thus making the discontinuities readily visible to the naked eye upon simple visual inspection; for example, the intermediate layer may be formed of any conventional plastic binder such as polyethylene, polypropylene, epoxy resin or the like containing a black pigment such as carbon black (which may also be electroconductive if desired) while the outer barrier layer may be polyethylene or polypropylene containing a white pigment such as titanium dioxide, or the pigments may be interchanged in the two layers. In both of the foregoing cases, in which the intermediate layer is electroconductive or of a color contrasting to that of the outer barrier layer or both, the outer surface of the intermediate layer need be no smoother or more regular than that of the foamed plastic layer over which it is applied in order to permit effective use of electroconductivity measurements or visual inspection methods. However, in another embodiment of the invention, the intermediate layer can be a layer of mastic or plastic which flows into and fills the irregularities of the foamed plastic surface so as to mate with it and itself provides a smooth outer face substantially free from the irregularities present in the outer face of the foamed plastic layer, thus making it possible to employ conventional optical reflecting or ultrasonic scanning procedures for detecting discontinuities in the overlying outer barrier layer. Such a smooth-faced intermediate layer may also be electroconductive or of a color contrasting to that of the outer barrier layer or both, if desired, thus making it possible to employ any one of the usual three test procedures (optical reflectance, ultrasonic scanning, or electrical detection) or to use simple visual inspection of the finished pipe.

Figure 2:
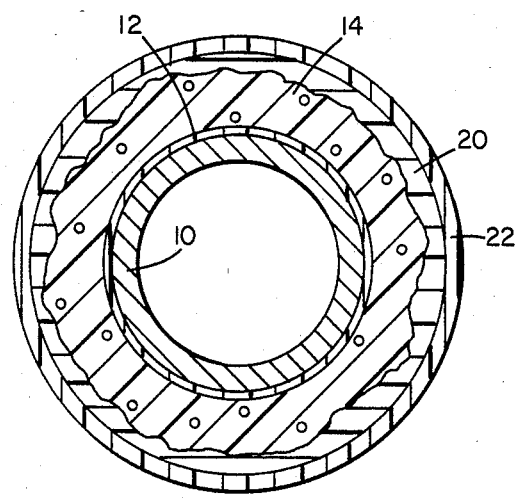

In the drawing,

FIG. 1 is a view in cross-section showing one embodiment of the present invention and, FIG. 2 is a view in cross-section showing another embodiment.

As shown in FIG. 1, steel pipe 10 is provided with a conventional primer and anti-corrosion coating 12 such as a butyl rubber adhesive composition over which is provided by spraying a foamed polyurethane plastic layer 14 varying (approximately 0.5–2 inches) in thickness having the usual irregular outer surface of a free rising foam layer. Intermediate layer 16 consists of a relative thin (2 to 30 mils) polyethylene tape containing electroconductive carbon black and having a layer of pressure sensitive adhesive composition on its inner face, the tape being applied in overlaping spiral form in the usual manner. The outer barrier layer 18 consists of polyethylene from 25 to 200 mils thick, preferably approximately 50 mils thick, containing titanium dioxide pigment to render it white and having a layer of pressure sensitive adhesive on its inner face, the tape being applied in one or more overlaping spirals. The discontinuities in the outer barrier layer can be detected either by conventional electrical conductivity test apparatus using intermediate layer 16 as one pole, or by simple visual inspection of the outer layer.

Metal foil tape, aluminum foil, can be substituted for the polyethylene tape to form intermediate layer 16 with excellent results when using the electrical conductivity test.

In the embodiment shown in FIG. 2, pipe 10 is provided with the same primer and anti-corrosion coating 12 and foamed polyurethane plastic layer 14 as shown in FIG. 1. However, in this embodiment the intermediate layer 20 is a relatively thick layer of mastic which flows into and fills the irregularities of the surface of layer 14, mating with the latter and presenting a substantially smooth even outer surface on which a conventional outer barrier layer 22 can be applied by spiral wrapping one or more turns of a polyethylene tape having a pressure sensitive adhesive coating on its inner face to provide a coating approximately 50 mils thick. Discontinuities in the outer barrier layer of this embodiment can be detected either by the usual optical reflectance test procedure or by means of the usual ultrasonic scanning test procedure. In addition, the incorporation in intermediate layer 20 of electroconductive carbon black particles would serve to render this layer both electroconductive and black in color, and the incorporation of a white pigment such as titanium dioxide in the outer barrier layer 22, would make it possible also to detect discontinuities in this layer by electrical conductivity testing or by visual inspection.

What is claimed is:

1. In a pipe coated with a thermal insulating layer of foamed plastic polymeric material having an irregular outer surface and an outer barrier layer of non-foamed plastic polymeric material, the improvement comprising an intermediate layer interposed between and bonded to said insulating layer and said outer barrier layer to facilitate detection of pinholes and other discontinuities in said outer barrier layer, said intermediate layer having an inner face which mates with the irregularities of said insulating layer and an outer face smooth and substantially free from said irregularities.

2. A coated pipe as claimed in claim 1 in which said intermediate layer is electroconductive.

3. In the method of detecting pinholes and other discontinuities in the outer barrier layer of metal pipe coated with a thermal insulating layer of foamed polymeric material having an irregular outer surface and an outer barrier layer of polymeric material which comprises measuring ultrasonic characteristics of said barrier layer, the improvement which comprises interposing between and bonding to said insulating layer and said outer barrier layer a layer of mastic which fills the irregularities of the surface of said insulating layer and which presents a substantially smooth even outer surface.

* * * * *